United States Patent
Cohen (10) Patent No.: US 7,604,749 B2
(45) Date of Patent: Oct. 20, 2009

(54) TECHNIQUES OF ANISOTROPIC WET ETCH MICROMACHINING FOR COMB DRIVE TRANSDUCERS AND RESONANCE FREQUENCY REDUCTION

(76) Inventor: Omer Cohen, 38A, Givat Downs Street, Haifa (IL) 34349

( * ) Notice: Subject to any disclaimer, the term of this patent is extended or adjusted under 35 U.S.C. 154(b) by 4 days.

(21) Appl. No.: 11/614,225

(22) Filed: Dec. 21, 2006

(65) Prior Publication Data

US 2007/0145008 A1    Jun. 28, 2007

Related U.S. Application Data

(60) Provisional application No. 60/753,986, filed on Dec. 23, 2005.

(51) Int. Cl.
*C23F 1/00*    (2006.01)
(52) U.S. Cl. .......................................................... 216/2
(58) Field of Classification Search ..................... 216/2, 216/83, 99
See application file for complete search history.

(56) References Cited

U.S. PATENT DOCUMENTS

| | | | | | |
|---|---|---|---|---|---|
| 5,563,343 | A | * | 10/1996 | Shaw et al. | 73/514.18 |
| 5,594,172 | A | * | 1/1997 | Shinohara | 73/514.33 |
| 5,883,012 | A | * | 3/1999 | Chiou et al. | 438/748 |
| 6,020,272 | A | * | 2/2000 | Fleming | 438/734 |
| 2002/0195417 | A1 | * | 12/2002 | Steinberg | 216/2 |

* cited by examiner

*Primary Examiner*—Roberts Culbert
(74) *Attorney, Agent, or Firm*—William H. Dippert; Eckert Seamans Cherin & Mellott, LLC (57) ABSTRACT

Wet anisotropic etching techniques are well known micromachining apparatus in MEMS technology. The wet anisotropic etchant etch some of the material crystal planes faster than the other. For example the (001) planes are etched much faster than the (111) planes. The final shape is dependent upon the etch mask and the crystal planes orientation. A technique is described hereafter where the nature of the wet anisotropic etch process is used for fabrication of electrostatic transducers and in particular electrostatic comb drive actuators and sensors. Using the same anisotropic wet etching technique it is possible to reduce the cross section of suspensions and thus to soften a spring or to change the resonance frequency of mechanical resonators. Final cross section is dependent of the etching time. Under the anisotropic wet etching the cross section of the suspensions is changed rapidly.

8 Claims, 10 Drawing Sheets

Fig. 9 a. Section A-A of fig. 9.

b. Section B-B of fig. 9.

c. Section C-C of fig. 9.

TECHNIQUES OF ANISOTROPIC WET ETCH MICROMACHINING FOR COMB DRIVE TRANSDUCERS AND RESONANCE FREQUENCY REDUCTION

This present application claims the benefit of earlier U.S. patent application Ser. No. 60/753,986 filed on Dec. 23, 2005, by Omer Cohen and entitled "Techniques of unisotropic wet etch micromachining for comb drive electro-static transducers and mechanical resonance frequency reduction".

FIELD OF THE INVENTION

The present invention relates to devices and methods for designing and/or fabricating of comb drive electro-static transducers and/or mechanical resonators with resonance frequency trimming ability, using anisotropic wet etch micromachining techniques. Comb drive electro-static transducers are very popular micromechanical elements, both as actuators and as sensors, serving as building blocks in many devices and applications, for example, accelerometers, optical switches, and optical scanners. Micromechanical resonators are also popular elements, serving as building blocks in many devices and applications, for example, rate gyros, and optical scanners. The resonance frequency accuracy of a micromechanical element, which is often a property of high importance, is often insufficient. Several apparatus for frequency adjustment were suggested. The frequency trimming related to within this invention is performed with the same apparatus for the fabrication of the mechanical resonator, using the anisotropic wet etch micromachining techniques.

BACKGROUND OF THE INVENTION

Fabrication of electro-mechanical devices utilizing MEMS technology enables to produce devices with typical dimensions of microns to millimeters. Usually these devices include transducers which enable them to move and sense the environment. One of the most useful transduction techniques for MEMS devices is electro-static. Electro-static transduction is performed by an electric capacitor which has a mechanical degree of freedom. Actuation is achieved by applying voltage or charge on the capacitor that causes opposite charges to extract each other and to the transducer to move. Sensing is achieved by changes of capacitance, such as relative displacement between capacitor plates, which cause a change in voltage or charge over the transducer.

Comb drives are of the most useful electro-static transducers. The comb drive has a mechanical degree of freedom that enables capacitor plates to move in parallel to each other. Moving one plate in parallel to the other changes the overlapping area and so the capacitance, and by that a transduction is made. Comb drives are so useful because they enable large displacement and highly sensitive transduction with comparison to other electro-static transducers.

A popular way to fabricate comb drives is by dry etching techniques and in particular Deep Reactive Ion Etch (DRIE). These fabrication techniques are expensive in the sense that they require expensive fabrication facilities and they are time consuming of the fabrication facilities.

Some useful MEMS devices such as raster scanners or rate gyros include mechanical resonators, with resonant frequency defined by the geometrical and material properties. Occasionally we find the critical dimensions of the mechanical resonator with less than order of magnitude larger than the dimensions' tolerances determined by the fabrication processes. In the case of large tolerances in comparison to dimensions there is a very poor accuracy in mechanical properties of the device, such as resonant frequency and spring coefficients. Applications that demand exact resonant frequency, such as raster scanners, must be tuned to the desired frequency.

Many ideas how to tune resonant frequency have been suggested. For example some suggested changing the vibrating mass using a laser beam to melt a metal foil upon the vibrating mass as additive to it. Others suggested changing the vibrating mass using materials that absorbs particles as much as needed. These methods and techniques requires an appropriate apparatus for frequency tuning, which is expensive, it is added to the fabrication apparatus, and often is time consuming. A simple, fabrication process compatible, low cost frequency tuning apparatus is required.

SUMMARY OF THE INVENTION

The present invention comprises devices fabricated with anisotropic wet etch processes. Anisotropic wet etching techniques, although they are time consuming of fabrication facilities, are lower in cost than dry etching techniques because the fabrication facilities are much lower in price. The anisotropic wet etched comb drive transducers do much the same as any other comb drive transducer but the fabrication of the wet etched comb drives is made by anisotropic wet etching techniques. The anisotropic wet etch is made by fluid etchant that etch the substrate (such as mono-crystalline Silicon) through an etch mask, applied by photolithography directly on the substrate or on an intermediation layer, following the crystal planes. Let us consider mono-crystalline Silicon as a non-limiting example. The etch rate of (001) planes in anisotropic wet etchant is much higher than the etch rate of (111) planes in the same environment. After a while the (001) planes are disappeared or highly deteriorated and (111) planes remain almost intact. A cross section trough (001) oriented micromachined layer after anisotropic wet etch reveals diagonal forms. The intermediation layer is required when the anisotropic wet etchant removes very quickly the photo-resist required for the lithography process. The intermediation layer is therefore substantially durable to the anisotropic wet etchant.

Figure 1:
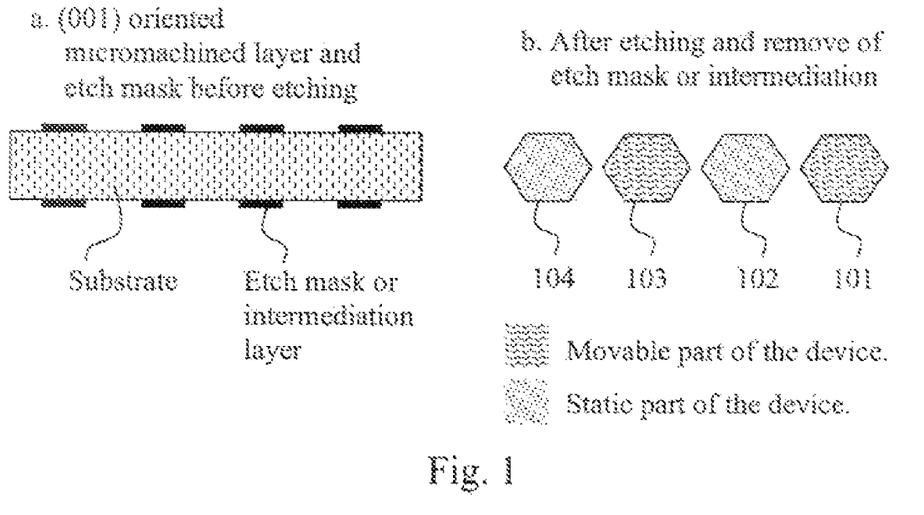
FIG. 1 shows a cross section of the micromachined layer with symmetric type etch mask in accordance with a preferred embodiment of the present invention.
Figure 2:
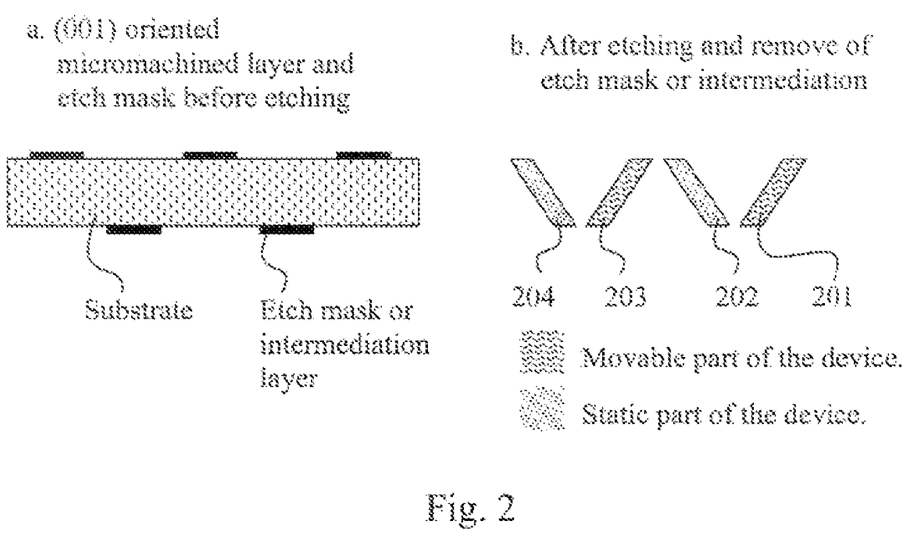
FIG. 2 shows a cross section of the micromachined layer with anti-symmetric type etch mask in accordance with a preferred embodiment of the present invention.
Figure 3:
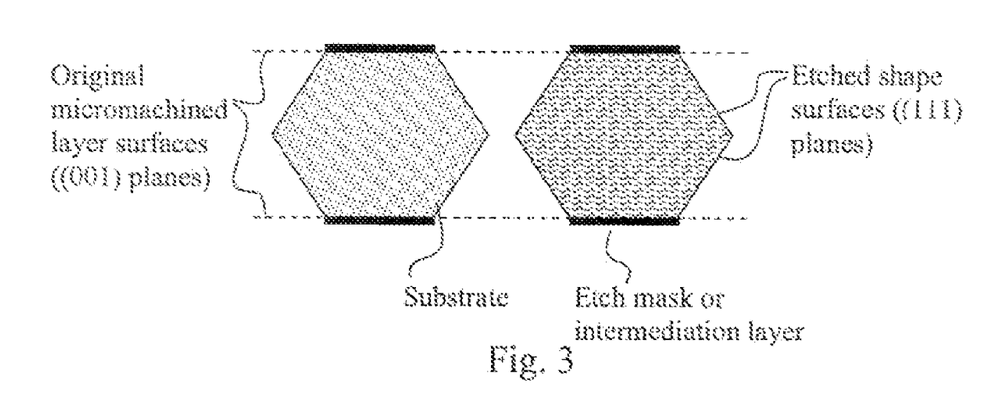
FIG. 3 is a schematic cross section that shows the crystal planes appearing after the anisotropic etch process using symmetric type etch mask in accordance with a preferred embodiment of the present invention. The original micromachined layer surface is (001) plane and the sidewalls of the comb teeth are (111) planes.
Figure 5:
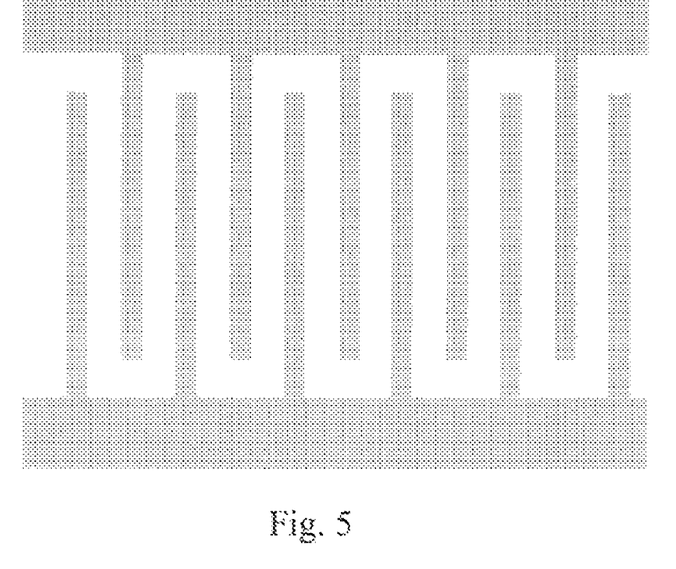
FIG. 5 is schematic top view of the symmetric type etch mask in accordance with a preferred embodiment of the present invention.
Figure 6:
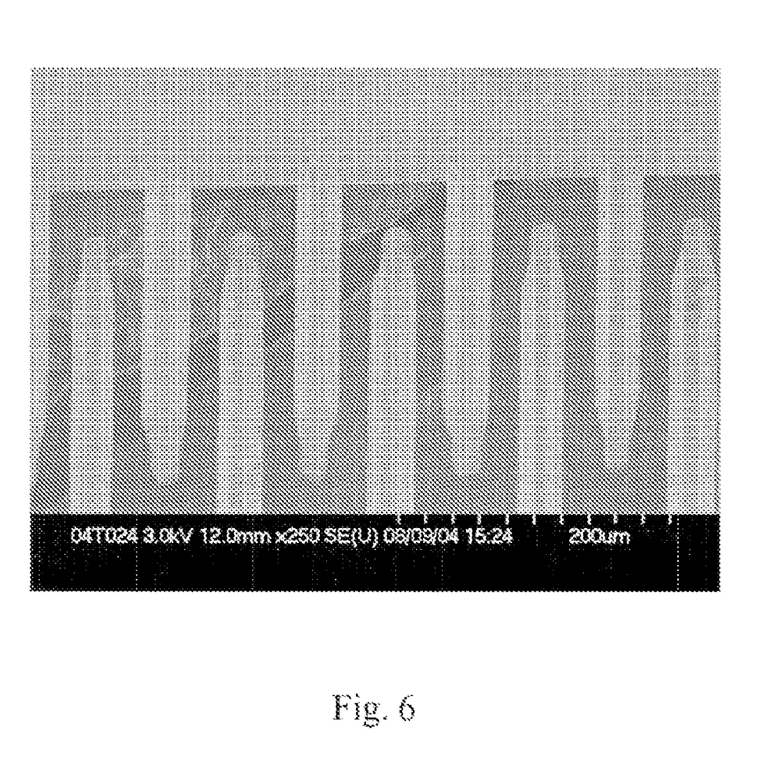
FIG. 6 shows a Scanning Electron Microscope picture of comb drive device fabricated using a symmetric type etch mask and anisotropic wet etch process in accordance with a preferred embodiment of the present invention.

According to the present invention the etching is performed simultaneously from both sides of (001) oriented micromachined layer either with symmetric type or anti-symmetric type of mask. The result cross sections are schematically illustrated in FIG. 1 and FIG. 2 respectively. The relations between the symmetric etch mask and the shape formed after the anisotropic wet etching are illustrated in FIG. 3. If controlled accurately the symmetric mask and the anisotropic wet etch form a hexagonal cross section features. The dimensions of these features are defined in FIG. 4. Choosing the thickness of the micromachined layer and mask features size it is possible to design the comb drive teeth width and gaps to a specific values as elaborated hereafter. A symmetric type etch mask with repeated features as described hereafter, which are detached from one end or from the other end alternately (as illustrated in FIG. 5), forms a comb drive transducer. Such a device is shown in FIG. 6 photographed by Scanning Electron Microscope.

Figure 7:
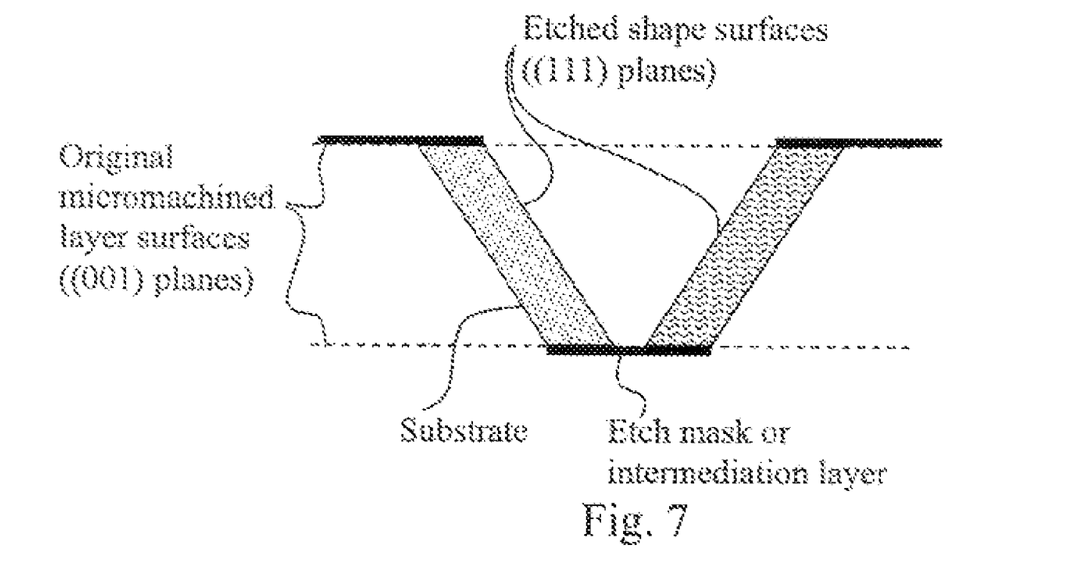
FIG. 7 is a schematic cross section that shows the crystal planes appearing after the anisotropic etch process using anti-symmetric type etch mask in accordance with a preferred embodiment of the present invention. The original micromachined layer surface is (001) plane and the sidewalls of the comb teeth are (111) planes.
Figure 9:
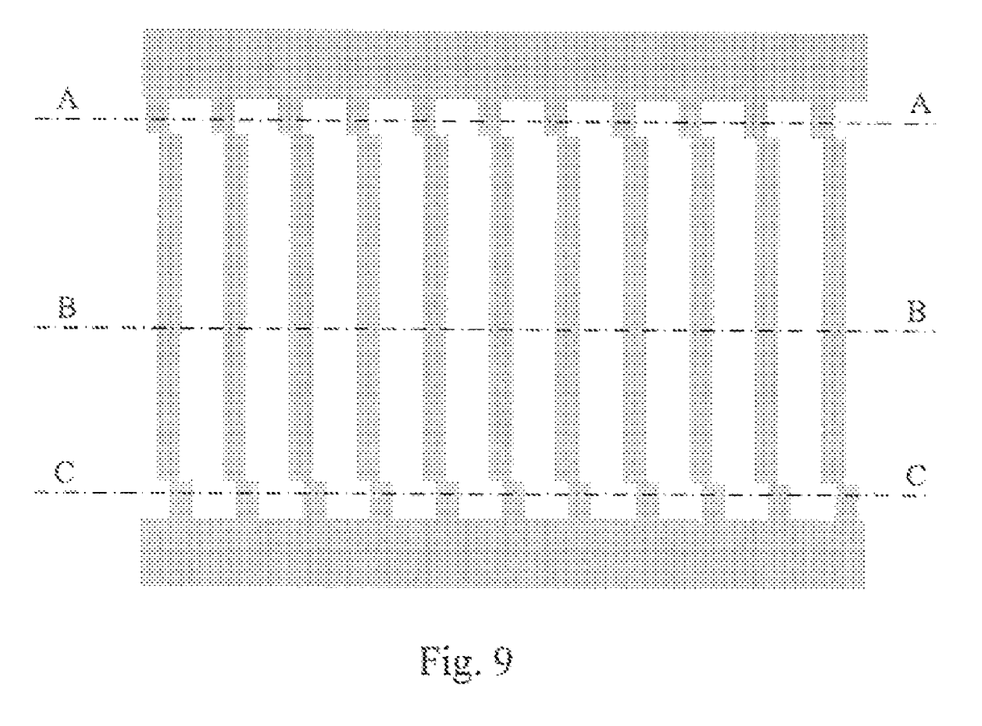
FIG. 9 is schematic top view of the anti-symmetric type etch mask in accordance with a preferred embodiment of the present invention.
Figure 10:
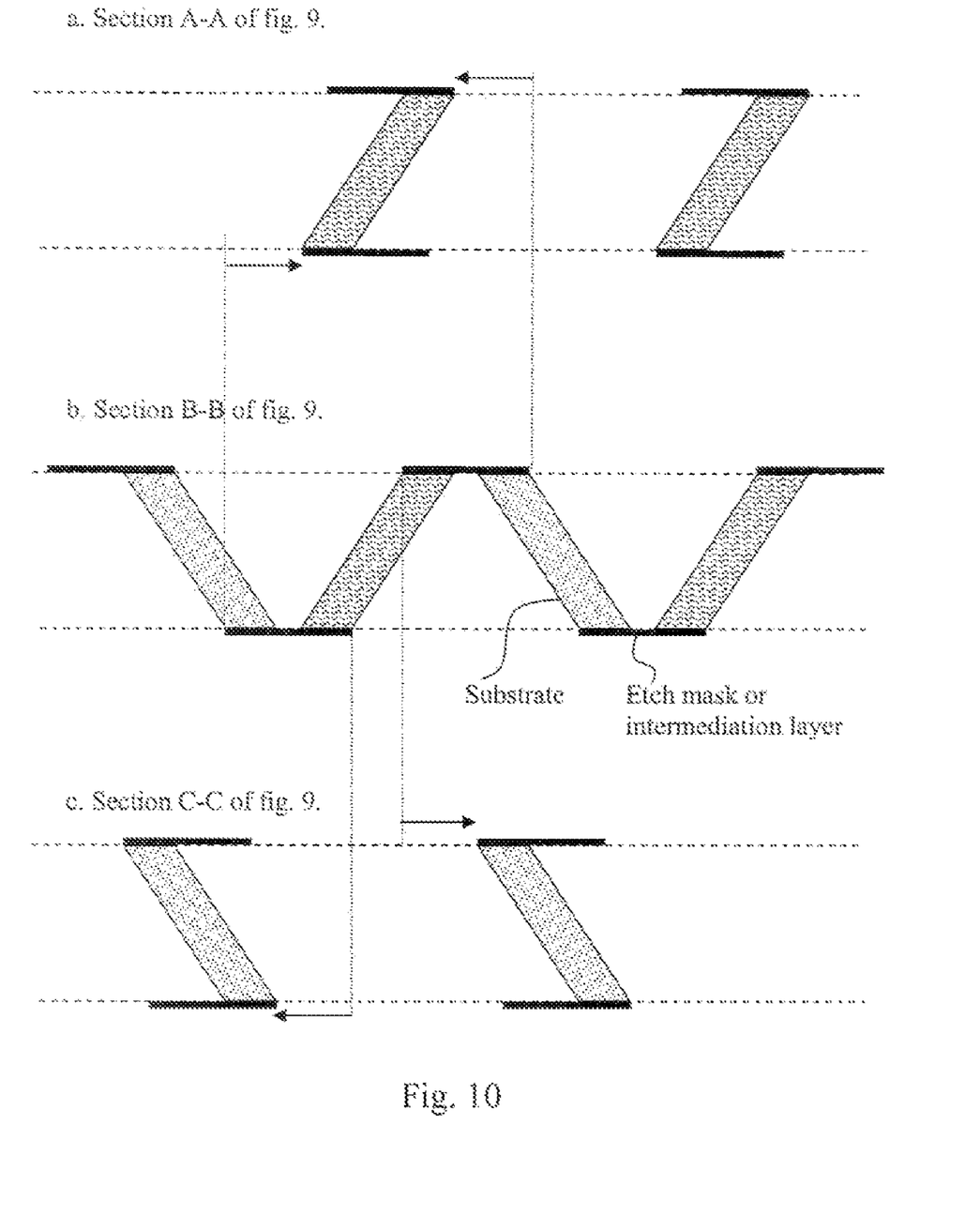
FIG. 10 is a schematic cross section showing the A-A, B-B and C-C cross section lines of the anti-symmetric comb drive defined in FIG. 9.
Figure 11:
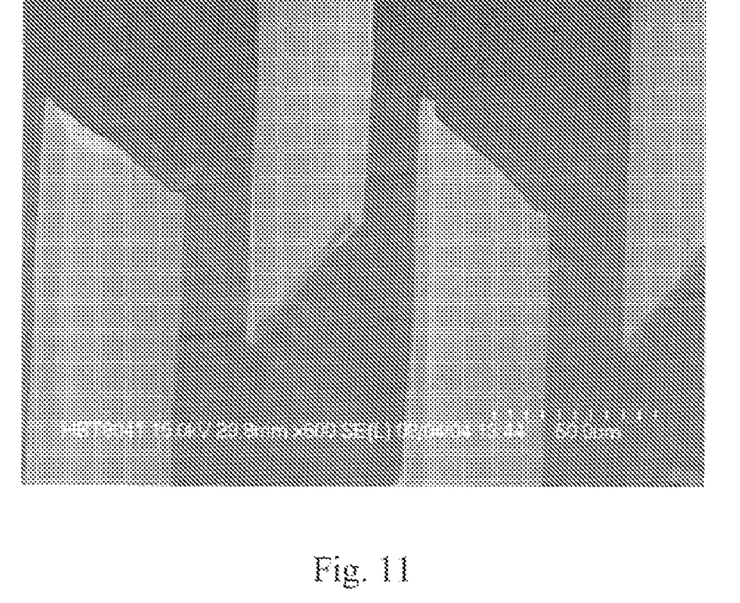
FIG. 11 shows a Scanning Electron Microscope picture of comb drive device fabricated using an anti-symmetric type etch mask and anisotropic wet etch process in accordance with a preferred embodiment of the present invention.

The relations between the anti-symmetric type etch mask and the shape formed after the anisotropic wet etching is illustrated in FIG. 7. The anti-symmetric mask and the anisotropic wet etch process form a diagonal cross section features. Accurate control of etch process is not necessary because the grooves from both sides of the micromachined layer do not intersect. The etch mask of one side of the micromachined layer serves as an etch stop to the other side grooves. The dimensions of these features are defined in FIG. 8. Choosing the thickness of the micromachined layer and mask features size it is possible to design comb drive teeth width and gaps to a specific values as elaborated hereafter. The anti-symmetric mask type is illustrated in FIG. 9. Unlike the symmetric type etch mask in the anti-symmetric type each mask the features that are related to comb teeth takes part in the formation of both a rotor tooth and a stator tooth. Therefore these features can not be detached from either side. The detachment of the teeth is created by the small shift at both ends of the teeth as illustrated in FIG. 10 and elaborated hereafter. It is also necessary to remove the etch mask or intermediation layer in order to enable its movement. Such a device is shown in FIG. 11 photographed by Scanning Electron Microscope.

Another embodiment of the present invention relates to a novel technique for resonant frequency reduction (trimming) or spring softening utilizing anisotropic wet etching from both sides of micro-machined layer simultaneously. The technique is based on the same fabrication process described above for comb drives fabrication and therefore it is possible but not necessary to fabricate comb drives together with resonant frequency reduction or spring softening in the same process. It is therefore a low cost and rapid frequency reduction (trimming) or spring softening process.

Therefore and in accordance with a preferred embodiment of the present invention, it is provided a method of anisotropic wet etching fabrication of a comb-drive comprising:

designing etch mask having symmetric or anti-symmetric features;
applying said etch mask directly on a micromachined layer or on an intermediation layer using lithography;
anisotropically wet etching of said micromachined layer.

Furthermore and in accordance with another preferred embodiment of the present invention, the method is combined with a method of anisotropic wet etching for trimming suspension springs comprising:

anisotropically wet etching of said micromachined layer simultaneously forming suspension spring and comb drive;
further anisotropically wet etching for suspension spring cross section reduction.

Furthermore and in accordance with another preferred embodiment of the present invention, said suspension spring is attached to vibrating bodies forming a mechanical resonator adapted for resonance frequency trimming.

Furthermore and in accordance with another preferred embodiment of the present invention, the method further comprises releasing the comb-drive by removing said intermediation layer.

Furthermore and in accordance with another preferred embodiment of the present invention, the method is combined with a method of anisotropic wet etching for trimming suspension springs comprising:

anisotropically wet etching of said micromachined layer simultaneously forming suspension spring and comb drive;
further anisotropically wet etching for suspension spring cross section reduction.

Furthermore and in accordance with another preferred embodiment of the present invention, said suspension spring is attached to vibrating bodies forming a mechanical resonator adapted for resonance frequency trimming.

It is further provided in accordance with yet another preferred embodiment of the present invention, a comb drive transducer comprising:

rotor comb teeth with hexagonal or diagonal cross section;
stator comb teeth with hexagonal or diagonal cross section.

In addition, it is provided in accordance with another preferred embodiment of the present invention, a method of anisotropic wet etching for trimming suspension springs comprising:

designing etch mask;
applying said etch mask directly on a micromachined layer or on an intermediation layer using lithography;
anisotropically wet etching of said micromachined layer forming suspension spring;
further anisotropically wet etching for suspension spring cross section reduction.

In addition and in accordance with another preferred embodiment of the present invention, said suspension spring is attached to vibrating bodies forming a mechanical resonator adapted for resonance frequency trimming.

BRIEF DESCRIPTION OF THE DRAWINGS

In order to better understand the present invention and appreciate its practical applications, the following Figures are attached and references herein. Like components are denoted by like reference numerals.

It should be noted that the figures are given as examples and preferred embodiments only and in no way limit the scope of the present invention as defined in the appending Description and Claims.

FIG. 1*a* shows the micromachined layer with the mask before the etch process. FIG. 1*b* shows the result of the etch process after the removal of the symmetric type etch mask or intermediation layer.

FIG. 2*a* shows the micromachined layer with the mask before the etch process. FIG. 2*b* shows the result of the etch process after the removal of the anti-symmetric type etch mask or intermediation layer.

FIG. 10a shows the A-A cross section near the upper end of comb drive where the right tilted comb teeth survive the etch process and the left tilted comb teeth do not survive the same process. FIG. 10b shows the B-B cross section at the middle portion of comb drive where both the right tilted comb teeth and the left tilted comb teeth survive the etch process. FIG. 10c shows the C-C cross section near the lower end of comb drive where the left tilted comb teeth survive the etch process and the right tilted comb teeth do not survive the same process. Also shown in FIG. 10 is the shift of the etch mask creating the three sections of the comb drive shown in sections A-A, B-B and C-C.

FIG. 14a is immediately after the suspension was formed where the suspension has hexagonal cross section. FIG. 14b is after a short continuance of anisotropic wet etching. FIG. 14c is after longer continuance of anisotropic wet etching.

DETAILED DESCRIPTION OF THE INVENTION AND FIGURES

Electro-static transduction, one of the most useful transduction techniques for MEMS devices, is performed by an electric capacitor which has a mechanical degree of freedom. Actuation is achieved by applying voltage or charge on the capacitor that causes opposite charges to extract each other and to the transducer to move. Sensing is achieved by changes of capacitance, such as relative displacement between capacitor plates, which cause a change in voltage or charge over the transducer. Comb drives are of the most useful electro-static transducers. The comb drive has a mechanical degree of freedom that enables capacitor plates to move in parallel to each other. Moving one plate in parallel to the other changes the overlapping area and so the capacitance, and by that a transduction is made.

The present invention comprises devices fabricated with anisotropic wet etch processes. A preferred embodiment of the present invention comprises of a symmetric type anisotropic wet etched comb drive electrostatic transducer. The anisotropic wet etch process is made by fluid etchant that etch the substrate (such as, but not limited to, mono-crystalline Silicon) through an etch mask, applied by photolithography directly on the substrate or on an intermediation layer, following the crystal planes. According to the suggested technique the etching is performed simultaneously from both sides of (001) oriented micromachined layer. Illustrated in FIG. 1 is the schematic cross section of a (001) oriented micromachined layer with symmetric type etch mask before anisotropic wet etching (FIG. 1a) and after the anisotropic wet etching (FIG. 1b). Let us consider mono-crystalline Silicon as a non-limiting example. The etch rate of (001) planes in anisotropic wet etchant is much higher than the etch rate of (111) planes in the same environment. After a while the (001) planes are disappeared or highly deteriorated and (111) planes remain almost intact. Grooves are created where the etch mask is open and micromachined layer is exposed to the etchant. Grooves are created simultaneously from both sides of micromachined layer. Etch process must be stopped immediately after the grooves from both sides of the micromachined layer meet together. If so, then the symmetric mask and the anisotropic wet etch form a hexagonal cross section features. Shown in FIG. 3 is a cross section through (001) oriented micromachined layer after anisotropic wet etch through symmetric type etch mask. The intermediation layer is required when the anisotropic wet etchant removes very quickly the photo-resist which is required for the lithography process. The intermediation layer is therefore substantially durable to the anisotropic wet etchant.

Figure 4:
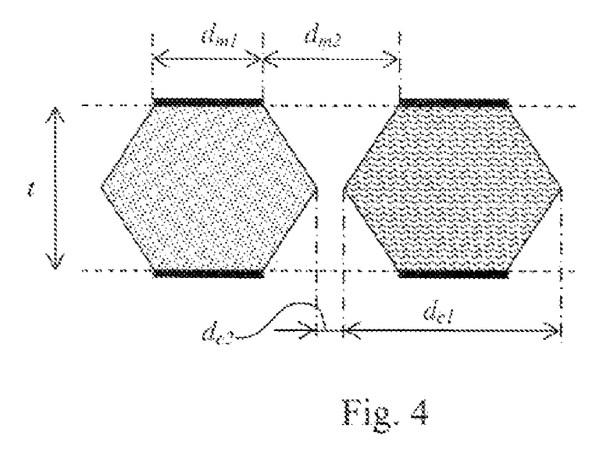
FIG. 4 is a schematic cross section view of symmetric type mask etched micromachined layer with dimensions definitions in accordance with a preferred embodiment of the present invention.

Further details are in FIG. 4. The dimensions of the features formed in the mono-crystalline micromachined layer ($d_{c1}$ and $d_{c2}$) are determined by the thickness of micro-machined layer (t), mask features ($d_{m1}$ and $d_{m2}$) and the well known crystal plane angles (θ). $d_{c1}$ can be designed to a specific value by controlling the thickness of the layer t and $d_{m1}$.

$$d_{c1} = d_{m1} + \frac{t}{\tan(\theta)}$$

$d_{c2}$ can be designed to a specific value by controlling the thickness of the layer t and $d_{m2}$.

$$d_{c2} = d_{m2} - \frac{t}{\tan(\theta)}$$

A symmetric type etch mask with repeated features as described above which are detached from one end or the other end alternately (as illustrated in FIG. 5) forms a comb drive transducer. Sufficient gap of the order of the gap between the comb teeth $d_{m2}$, must be made at the detached end of the comb tooth in order to release it. In such an apparatus the teeth detached from one end may be the movable part of the device corresponding to items 101 and 103 in FIG. 1 while the teeth detached from the other side may be the static part of the device corresponding to items 102 and 104 in FIG. 1. FIG. 6 shows a device fabricated according to the described above, photographed by scanning electron microscope.

Another preferred embodiment of the present invention comprises of an anti-symmetric type anisotropic wet etched comb drive electrostatic transducer. The anisotropic wet etch process is made by fluid etchant that etch the substrate (such as, but not limited to, mono-crystalline Silicon) through an etch mask, applied by photolithography directly on the substrate or on an intermediation layer, following the crystal planes. According to the suggested technique the etching is performed simultaneously from both sides of (001) oriented micromachined layer. Illustrated in FIG. 2 is the schematic cross section of a (001) oriented micromachined layer with anti-symmetric type etch mask before anisotropic wet etching (FIG. 2a) and after the anisotropic wet etching (FIG. 2b). Shown in FIG. 7 is a cross section through (001) oriented micromachined layer after anisotropic wet etch through anti-symmetric type etch mask. The anti-symmetric mask and the anisotropic wet etch process form a diagonal cross section features. In contrast to the symmetric type comb drive device the grooves from both sides of the micromachined layer in the case of anti-symmetric device do not intersect. The etching of the mono-crystalline micromachined layer is terminated when the grooves reach the under face of the etch mask layered on the other side of the micromachined layer. The etch mask of one side of the micromachined layer serves as an etch stop to the other side grooves. In order to enable movement it is necessary to remove the etch mask or intermediation layer after the etch process because a single feature in the etch mask creates both a movable tooth (rotor) and a static tooth (stator). The intermediation layer is required when the anisotropic wet etchant removes very quickly the photo-resist which is required for the lithography process. The intermediation layer is therefore substantially durable to the anisotropic wet etchant.

Figure 8:
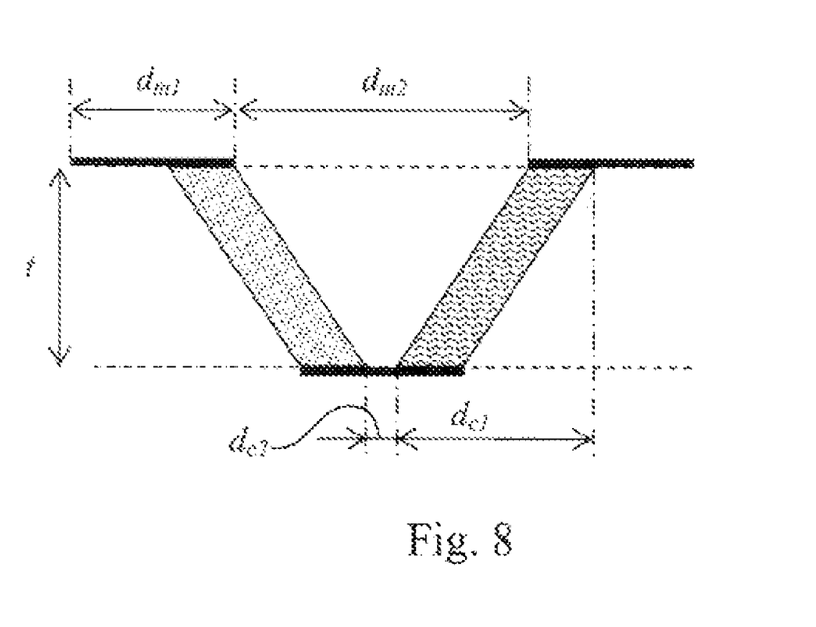
FIG. 8 is a schematic cross section view of anti-symmetric type mask etched micromachined layer with dimensions definitions in accordance with a preferred embodiment of the present invention.

Further details are in FIG. 8. The dimensions of the features formed in the mono-crystalline micromachined layer ($d_{c1}$ and $d_{c2}$) are determined by the thickness of micro-machined layer (t), mask features ($d_{m1}$ and $d_{m2}$) and the well known crystal plane angles ($\theta$). $d_{c1}$ can be designed to a specific value by controlling the thickness of the layer t and $d_{m1}$.

$$d_{c1} = \frac{2t}{\tan(\theta)} + \frac{d_{m1} - d_{m2}}{2}$$

$d_{c2}$ can be designed to a specific value by controlling the thickness of the layer t and $d_{m2}$.

$$d_{c2} = d_{m2} - \frac{2t}{\tan(\theta)}$$

The anti-symmetric mask type is illustrated in FIG. 9. Unlike the symmetric type etch mask in the anti-symmetric type each mask the features that are related to comb teeth takes part in the formation of both a rotor tooth and a stator tooth. Therefore these features can not be detached from either side. The detachment of the teeth is created by the small shift at both ends of the teeth as illustrated in FIG. 10. At one tooth end the shift in the top mask is to the left and in the bottom mask is to the right (FIG. 10a) while in the other end of the tooth the shift in the top mask is to the right and in the bottom mask is to the left (FIG. 10c). In such an apparatus the teeth detached from one end may be the movable part of the device corresponding to items 201 and 203 in FIG. 2 while the teeth detached from the other side may be the static part of the device corresponding to items 202 and 204 in FIG. 2. Such a device is photographed by scanning electron microscope in FIG. 11.

Figure 12:
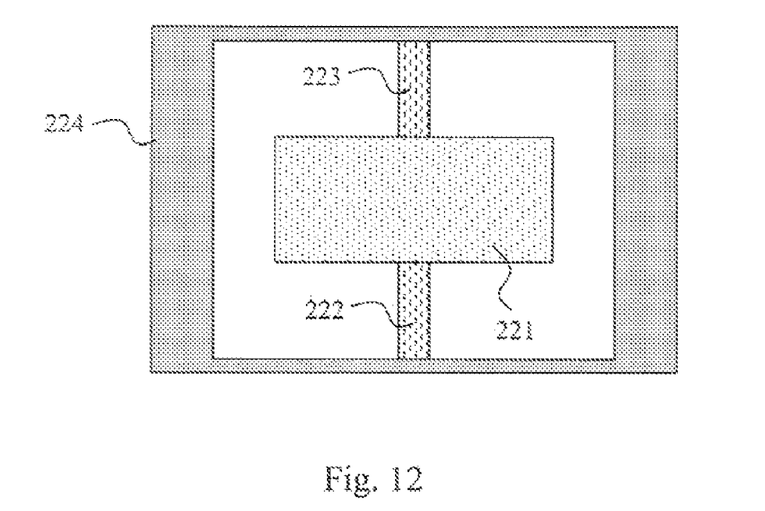
FIG. 12 shows a schematic top view of a mechanical resonator including static frame 204, vibrating mass or inertia body 201 and suspensions 202 and 203 that hold them together in accordance with a preferred embodiment of the present invention.
Figure 13:
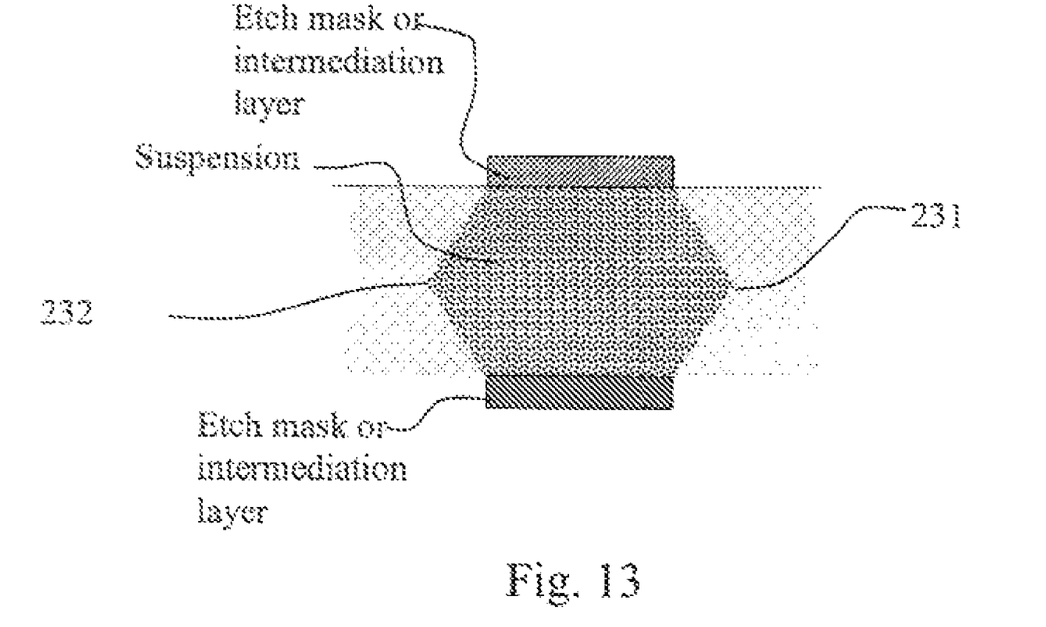
FIG. 13 shows a schematic hexagonal cross section of a suspension created by anisotropic wet etch process in accordance with a preferred embodiment of the present invention.
Figure 14:
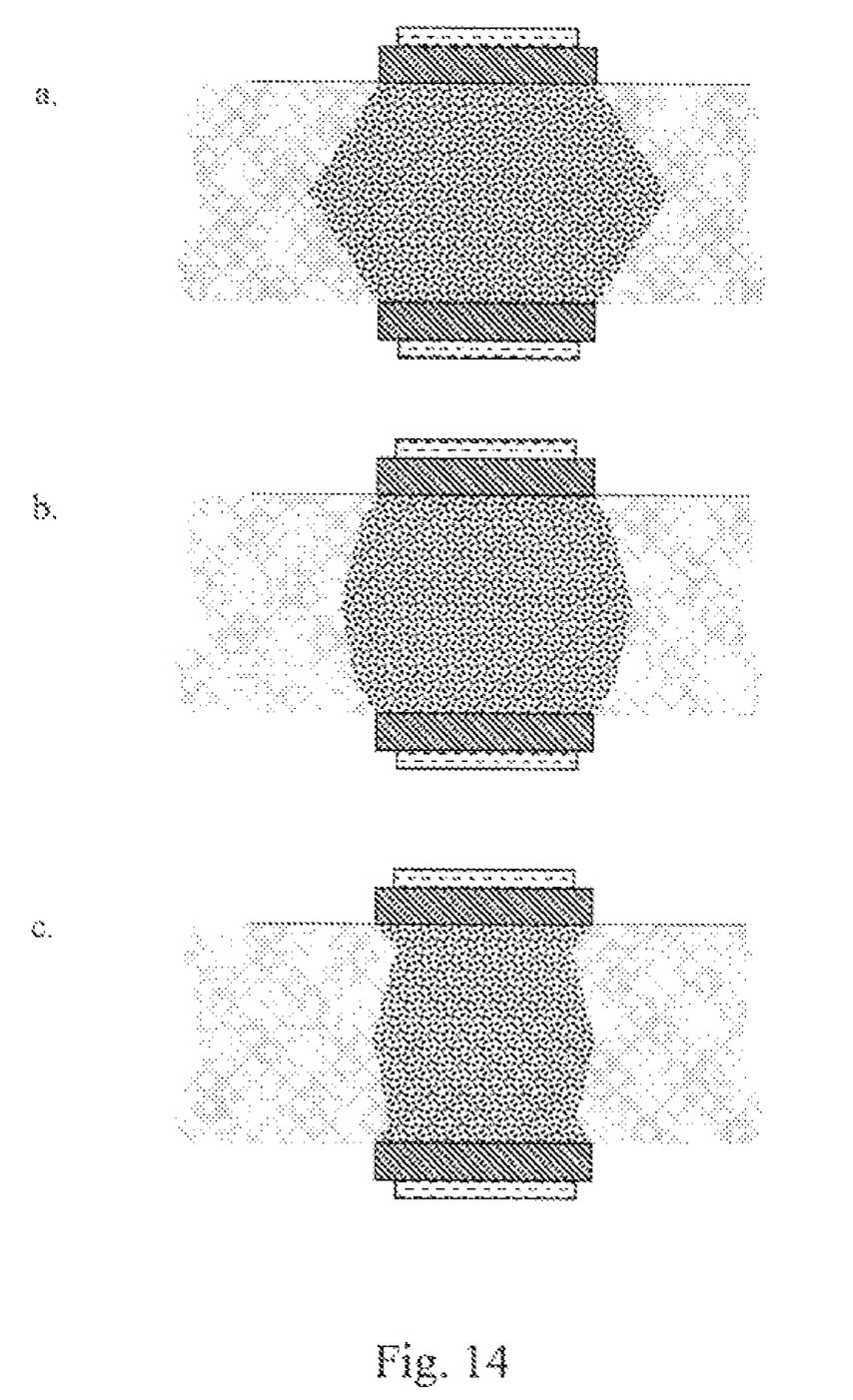
FIG. 14 shows the change of suspension cross section due to continuance of the anisotropic wet etch process after the suspension cross section form of FIG. 13 was created.
Figure 15:
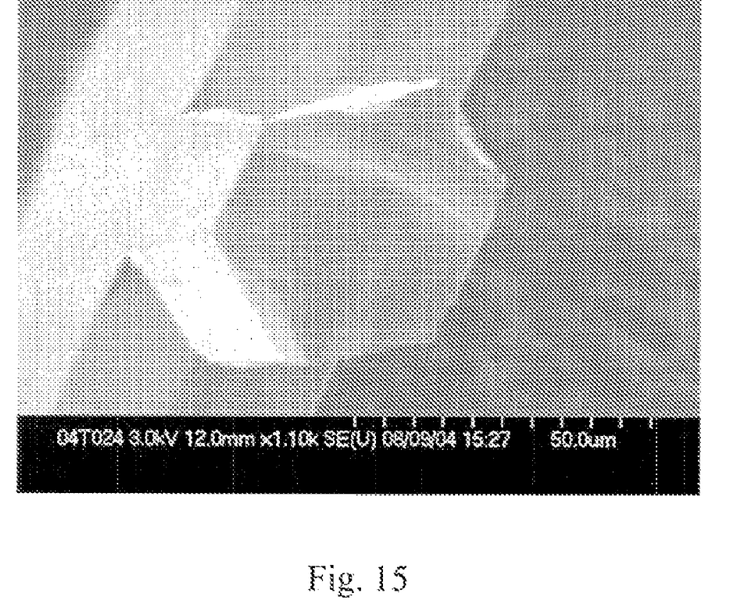
FIG. 15 shows a Scanning Electron Microscope picture of suspension hexagonal cross section immediately after the suspension was formed by anisotropic wet etch process in accordance with a preferred embodiment of the present invention.
Figure 16:
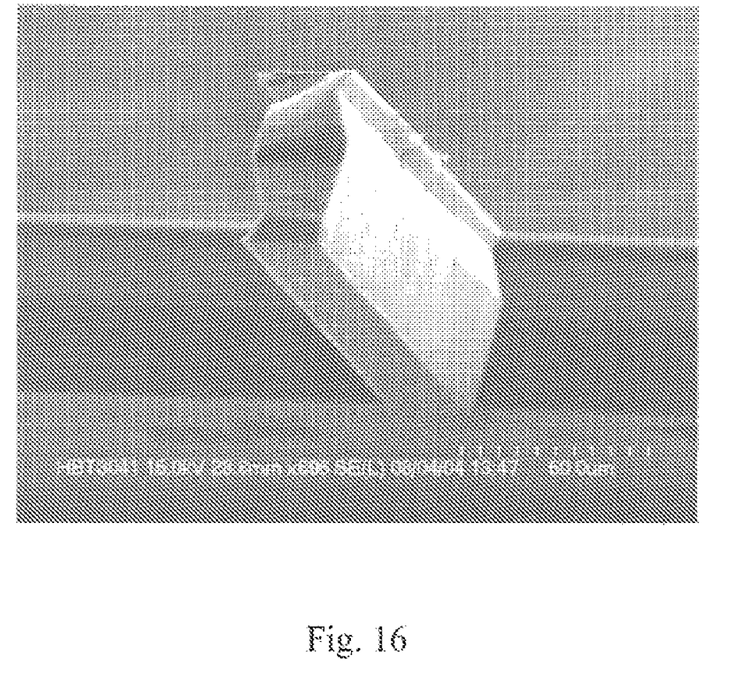
FIG. 16 shows a Scanning Electron Microscope picture of suspension cross section with dramatically changed cross section due to the continuance of the anisotropic wet etch process in accordance with a preferred embodiment of the present invention.

Another useful embodiment of the present invention is related to the mechanical resonator which is schematically illustrated in FIG. 12. The mechanical resonance frequency is defined by the geometrical and material properties. Micromachining dimensions' tolerances determined by the fabrication processes are relatively large with respect to the dimensions of the device features. In the case of large tolerances with respect to the dimensions there is a very poor accuracy in mechanical properties of the device, such as resonant frequency and spring coefficients. The present invention comprises a novel technique for resonant frequency reduction (trimming) and/or spring softening utilizing anisotropic wet etching process. The technique is based on the same fabrication process described above for comb drives fabrication and therefore it is possible but not necessary to fabricate comb drives together with resonant frequency reduction (trimming) or spring softening in the same process. The resonator shown in FIG. 12 includes a vibrating mass or inertia body 221 hanged on spring suspensions 222 and 223. The suspensions are attached to a static frame 224 which connects the resonator to its surroundings. In the suggested novel technique for resonant frequency reduction (trimming) or spring softening the suspensions 222 and 223 are fabricated by anisotropic wet etching from both sides of micro-machined layer simultaneously. The suspensions 222 and 223 are formed by symmetric etch mask similar to the symmetric mask for comb drive fabrication. Therefore the suspensions 222 and 223 have a hexagonal cross section as illustrated in FIG. 13. As the process reaches the stage where the simultaneously etching from both sides intersects, convex corners 231 and 232 are formed. It is well known that anisotropic wet etching rapidly etches convex corners revealing the fastest etched crystal planes. Continuance of the anisotropic wet etching process changes dramatically the geometry of the suspensions 222 and 223 and reduces their cross section. The illustration in FIG. 14 exhibits the cross section at the time where the simultaneously etching from both sides intersects (FIG. 14a), after a short continuance of the etch process (FIG. 14b) and after a longer continuance of the etch process (FIG. 14c). The hexagonal cross section of a suspension, corresponding to the illustration in FIG. 14a, photographed by Scanning Electron Microscope, is shown in FIG. 15. The former hexagonal cross section of a suspension after continuance of anisotropic wet etching, corresponding to the illustration in FIG. 14c, photographed by scanning electron microscope is shown in FIG. 16. The reduction of cross section using the anisotropic wet etch process as described above reduces the suspensions spring coefficient and therefore softens the springs or reduces the resonant frequency of the mechanical resonator. This etch process can be continued till the desired cross section is reached. During the process the sidewalls of the vibrating body 221 as well as the sidewalls of the frame 224 might also be etched (depending on the specific design). Designing a relatively large vibrating body 221 and large frame 224 makes the effect of the etch continuance on these features into insignificant. Other features of the device should be durable for short period of time to the continuance of the etch process. It is therefore recommended to (but not limited to) use anti-symmetrical type comb drives and not symmetrical type comb drives together with the frequency reduction or spring softening procedure. Other combinations of transducers, for example (not limiting) parallel plate electrostatic transducers, together with the suggested novel technique for suspensions cross section reduction are also possible.

It should be clear that the description of the embodiments and attached Figures set forth in this specification serves only for a better understanding of the invention, without limiting its scope as covered by the following Claims.

It should also be clear that a person skilled in the art, after reading the present specification can make adjustments or amendments to the attached Figures and above described embodiments that would still be covered by the following Claims.

The invention claimed is:

1. A method for preparing a comb drive from an (001) oriented mono-crystalline substrate having top and bottom surfaces by anisotropic wet etching the substrate from both sides simultaneously, which comprises the steps of:
    designing a lithography mask having anti-symmetric type comb-drive mask features relating to both rotor teeth and stator teeth and shifts of said mask features for alternately detaching comb teeth;
    applying the lithography mask by means of lithography and creating an etch mask directly on a micromachined layer or an intermediation layer on each of the top and bottom surfaces of the (001) oriented mono-crystalline substrate, wherein the etch mask on one surface of the substrate is anti-symmetrically aligned with regard to the etch mask on the other surface of the substrate;
    simultaneously anisotropically wet etching the micromachined layer from both sides of the substrate to form alternately detached comb-drive teeth having a vertically anti-symmetric diagonal cross-section where a single tooth is created from both top surface and bottom surface etch mask features; and
    releasing the anti-symmetric comb-drive teeth by removing the etch mask or intermediation layer,
    wherein no preceding or succeeding dry etching of said substrate is required.

2. The method of claim 1, wherein the anisotropic wet etching is further continued for trimming suspension springs, comprising:
    anisotropically wet etching said micromachined layer from both sides of the substrate to simultaneously form a suspension spring and a comb drive; and
    further anisotropically wet etching for suspension spring cross-section reduction.

3. The method of claim 2, wherein the suspension spring is attached to vibrating bodies forming a mechanical resonator adapted for resonance frequency trimming.

4. A method of anisotropic wet etching for trimming suspension springs comprising:
    designing an etch mask;
    applying the etch mask directly on a micromachined layer or on an intermediation layer using lithography;
    anisotropically wet etching said micromachined layer to form a suspension spring; and
    further anisotropically wet etching for suspension spring cross-section reduction.

5. The method of claim 4, wherein said suspension spring is attached to vibrating bodies to form a mechanical resonator adapted for resonance frequency trimming.

6. A method for preparing a comb drive from an (001) oriented mono-crystalline substrate having top and bottom surfaces by anisotropic wet etching the substrate from both sides simultaneously, which comprises the steps of:
    designing a lithography mask having symmetric type comb-drive mask features and alternately detaching comb-drive mask features;
    applying the lithography mask by means of lithography and creating an etch mask directly on a micromachined layer or an intermediate layer on each of the top and bottom surfaces of the (001) oriented mono-crystalline substrate, wherein the etch mask on one surface of the substrate is symmetrically aligned with regard to the etch mask on the other surface of the substrate; and
    simultaneously anisotropically wet etching the micromachined layer from both sides of the substrate to form alternately detached comb-drive teeth having a vertically symmetric hexagonal cross-section where a single tooth is created from both top surface and bottom surface etch mask features,
    wherein no preceding or succeeding dry etching of said substrate is required.

7. The method of claim 6, wherein the anisotropic wet etching is further continued for trimming suspension springs, comprising:
    anisotropically wet etching said micromachined layer from both sides of the substrate to simultaneously form a suspension spring and a comb drive; and
    further anisotropically wet etching for suspension spring cross-section reduction.

8. The method of claim 7, wherein the suspension spring is attached to vibrating bodies forming a mechanical resonator adapted for resonance frequency trimming.

* * * * *